(12) United States Patent
Chang et al.

(10) Patent No.: US 8,472,622 B2
(45) Date of Patent: Jun. 25, 2013

(54) WIRELESS COMMUNICATION METHOD, INFORMATION ACCESS METHOD, AND VIRTUAL ANTENNA RADIATION PATTERN FORMING METHOD

(75) Inventors: Chieh-Fu Chang, Taipei (TW); Wan-Hsin Hsieh, Dayuan Township, Taoyuan County (TW); Ming-Seng Kao, Hsinchu (TW)

(73) Assignee: National Applied Research Laboratories, Taipei (TW)

( * ) Notice: Subject to any disclaimer, the term of this patent is extended or adjusted under 35 U.S.C. 154(b) by 1102 days.

(21) Appl. No.: 12/401,078

(22) Filed: Mar. 10, 2009

(65) Prior Publication Data
US 2010/0235708 A1 Sep. 16, 2010

(51) Int. Cl.
*H04L 9/00* (2006.01)

(52) U.S. Cl.
USPC ............ 380/34; 714/11.002; 714/11.032; 375/295; 380/270

(58) Field of Classification Search
USPC ............ 714/752, E11.002, E11.032, 11.002, 714/11.032; 375/295; 380/270, 34
See application file for complete search history.

(56) References Cited

U.S. PATENT DOCUMENTS
2003/0115533 A1 * 6/2003 Asada et al. .................. 714/758

FOREIGN PATENT DOCUMENTS
EP 0852438 7/1998

* cited by examiner

*Primary Examiner* — Jung Kim
*Assistant Examiner* — Ayoub Alata
(74) *Attorney, Agent, or Firm* — Allen, Dyer, Doppelt, Milbrath & Gilchrist, P.A

(57) ABSTRACT

A wireless communication method for transmitting information to the designated region with the boundary defined by the sharp cutoff is provided. Receivers outside the designated region are excluded from retrieving the encoded information. The boundary of designated region is adjustable. The wireless communication method can be applied to clearly defining the accepted region and rejection region in satellite communications. The wireless communication method includes steps of providing an information; encoding the information into an encoded data regarding a designated bit-energy-to-noise-ratio; transmitting the encoded data to form a virtual antenna radiation pattern covering a designated region with boundary defined by the sharp cutoff based on the designated bit-energy-to-noise-ratio; receiving the encoded data; and decoding the encoded data into the original information only when receivers within the designated region with bit-energy-to-noise-ratio no less than the designated bit-energy-to-noise-ratio. The critical feature of the method is clarified by experiments on the communication satellite ST-1.

13 Claims, 7 Drawing Sheets

Two kinds of decoded images.

WIRELESS COMMUNICATION METHOD, INFORMATION ACCESS METHOD, AND VIRTUAL ANTENNA RADIATION PATTERN FORMING METHOD

FIELD OF THE INVENTION

The present invention relates to a wireless communication method, and more particularly to a virtual antenna radiation pattern forming method.

BACKGROUND OF THE INVENTION

Antenna is an essential component in wireless communications and the coverage area of the signal from an antenna is characterized by the antenna radiation pattern. In general, an antenna radiation pattern covers a designated beamwidth region as well as some beamwidth region outside the designated beamwidth region. Since the gain of the antenna radiation pattern outside the designated beamwidth region does not promptly reduce to a negligible level, the data transmitted from a transmitter to a receiver will partially leak to the beamwidth region outside the designated beamwidth region to be received by undesired users. Consequently, the undesired users may obtain the data with higher error probability.

To solve the above problem, spot beam antenna, first appeared in 1993, can highly concentrate the radiated energy within the designated beamwidth region so as to exclude the users outside the designated beamwidth region from receiving the signals. However, physical antenna designs are needed to achieve the desired performance. When the required beamwidth is narrow, elaborate designs on antenna components, such as feeder systems, structure of reflectors, and aperture distributions, are extremely expensive in practice. Besides, the beamwidth is also difficult to be adjusted physically.

SUMMARY OF THE INVENTION

It is therefore an object of the present invention to provide a virtual antenna radiation pattern forming method for transmitting the encoded information to form a virtual antenna radiation pattern, in which the designated beamwidth is clearly defined by the sharp cutoff based on the designated bit-energy-to-noise-ratio. A multistage coding scheme is used in the virtual antenna radiation pattern forming method. The more the coding stages for the information are, the sharper the designated beamwidth of the virtual antenna radiation pattern thereby is. In addition, the designated beamwidth is adjusted with a technique of artificial errors in the coding scheme.

According to the foregoing object of the present invention, a wireless communication method is provided. The wireless communication method includes steps of providing an original information; encoding the original information into an encoded data regarding a designated bit-energy-to-noise-ratio; transmitting the encoded data to form a virtual antenna radiation pattern covering a designated region with boundary defined by the sharp cutoff based on the designated bit-energy-to-noise-ratio; receiving the encoded data; and decoding the encoded data into the original information only when receivers within the designated region with bit-energy-to-noise-ratio no less than the designated bit-energy-to-noise-ratio.

An information access method based on the above wireless communication method is also provided.

A virtual antenna radiation pattern forming method based on the above wireless communication method is further provided.

The foregoing and other features and advantages of the present invention will be more clearly understood through the following descriptions with reference to the drawings, wherein:

DETAILED DESCRIPTION OF THE PREFERRED EMBODIMENT

The present invention will now be described more specifically with reference to the following embodiments. It is to be noted that the following descriptions of preferred embodiments of this invention are presented herein for the purposes of illustration and description only; it is not intended to be exhaustive or to be limited to the precise form disclosed.

In the present invention, what introduced is a distinct multistage coding scheme to attain the virtual antenna radiation pattern with designated beamwidth clearly defined by the sharp cutoff, and users outside the designated beamwidth are prevented from retrieving the transmitted information. In addition, the designated beamwidth is adjustable.

Figure 1:
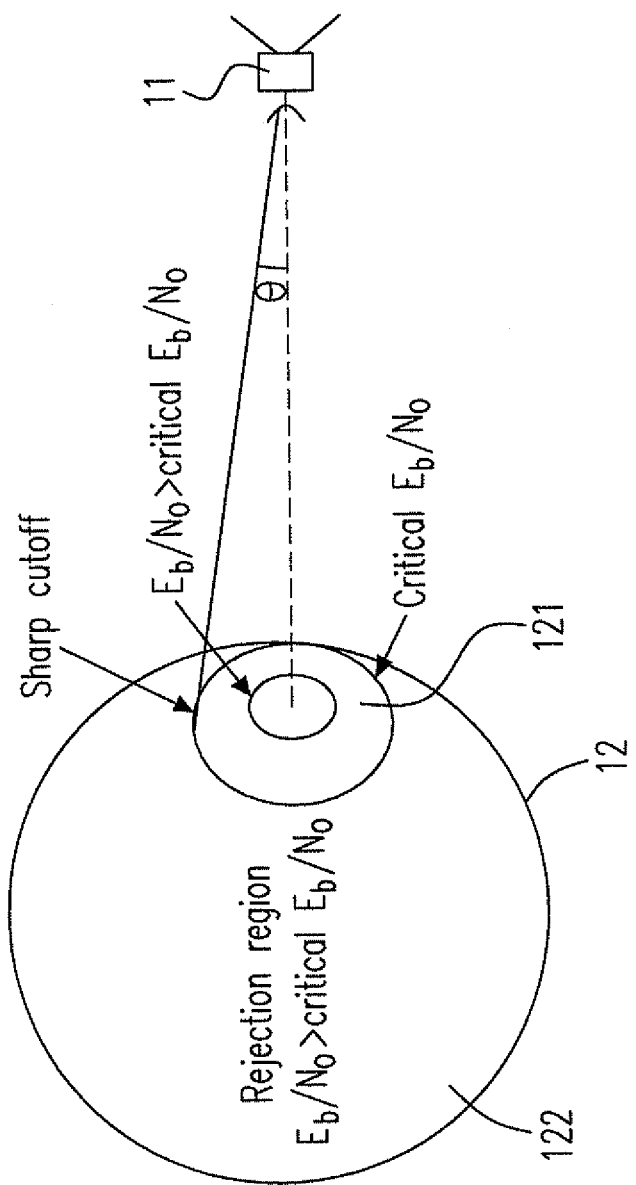
FIG. 1 is a diagram schematically showing the wireless communication method according to the present invention.

To describe the wireless communication method provided in the present invention, take satellite communications for example. Please refer to FIG. 1, which is a diagram schematically showing the wireless communication method according to the present invention. The information is transmitted from the satellite 11 to earth 12. Before being transmitted, the information is encoded into an encoded data regarding a designated bit-energy-to-noise-ratio (critical $E_b/N_o$). Based on the designated bit-energy-to-noise-ratio, the encoded data is transmitted toward earth 12 to form a virtual antenna radiation pattern covering a designated region with boundary defined by the sharp cutoff. The designated region defined by the sharp cutoff can be regarded as an accepted region 121, while the other region outside the accepted region 121 on earth 12 is rejection region 122. Any receiver within the accepted region 121 receiving the encoded data with bit-energy-to-noise-ratio no less than the critical $E_b/N_o$ can decode the encoded data into the original information. On the other hand, any receiver outside the accepted region 121 receiving the encoded data fails to decode the encoded data since the corresponding bit-energy-to-noise-ratio is less than the critical $E_{b/No}$. That is to say, the data power of the encoded data received in the rejection region 122 is less than that received within the accepted region 121. The wireless communication method provided in the present invention is applied based on the bit-energy-to-noise-ratio ($E_b/N_o$) of the received encoded data related to the data power thereof.

Figure 2:
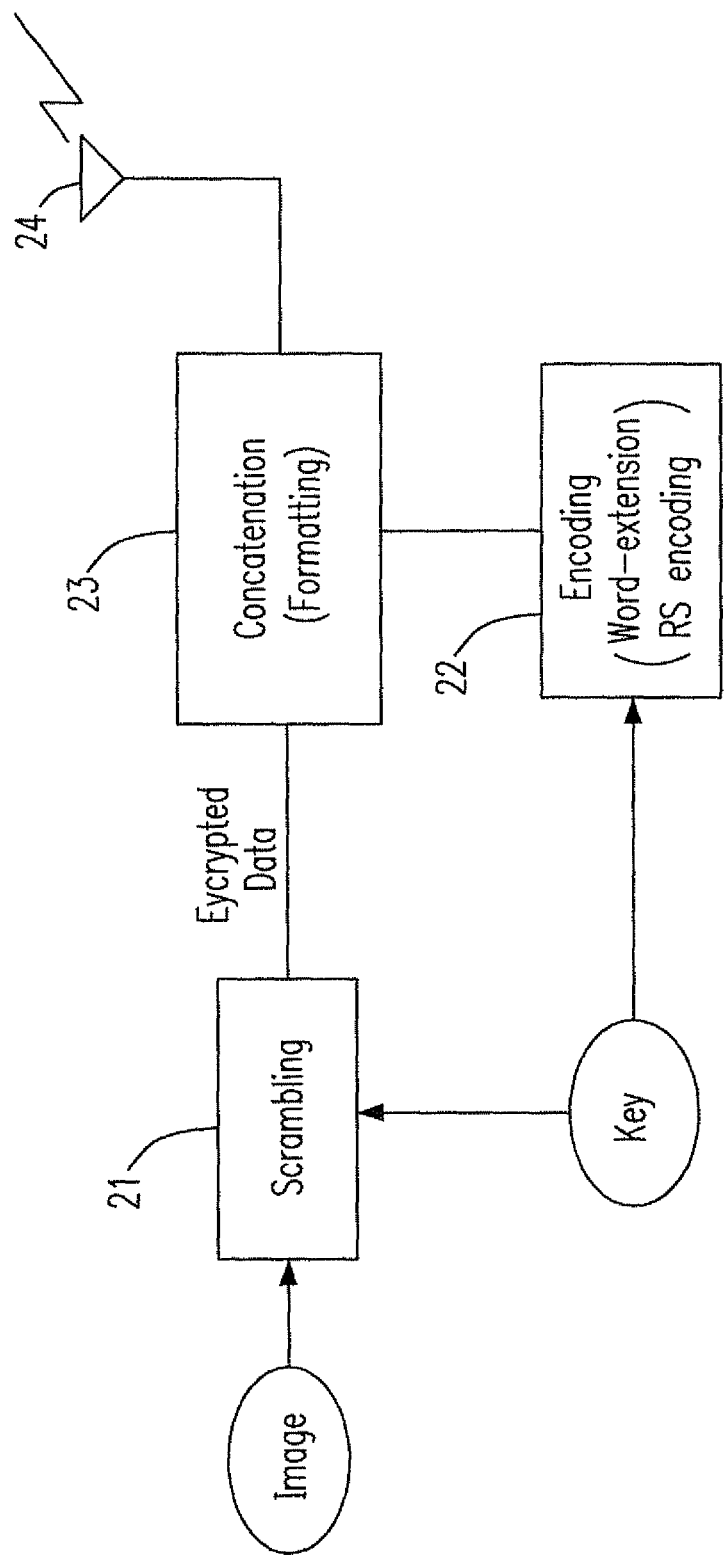
FIG. 2 is a diagram schematically showing the implementation at the transmitter using the wireless communication method according to the present invention.

Please refer to FIG. 2, which is a diagram schematically showing the implementation at the transmitter using the wireless communication method according to the present invention. As shown in FIG. 2, the information to be transmitted (image) is scrambled with an encryption key in block 21 and the encryption key is encoded into the encoded encryption key with at least one encoding stage regarding the designated bit-energy-to-noise-ratio in block 22. The designated bit-energy-to-noise-ratio is adjusted with a number of artificial errors inserted in the encoded encryption key after the last encoding stage in block 22. The encoded data includes the encoded encryption key and the scrambled information, which are concatenated in block 23 and transmitted through the antenna 24 of the transmitter.

Figure 3:
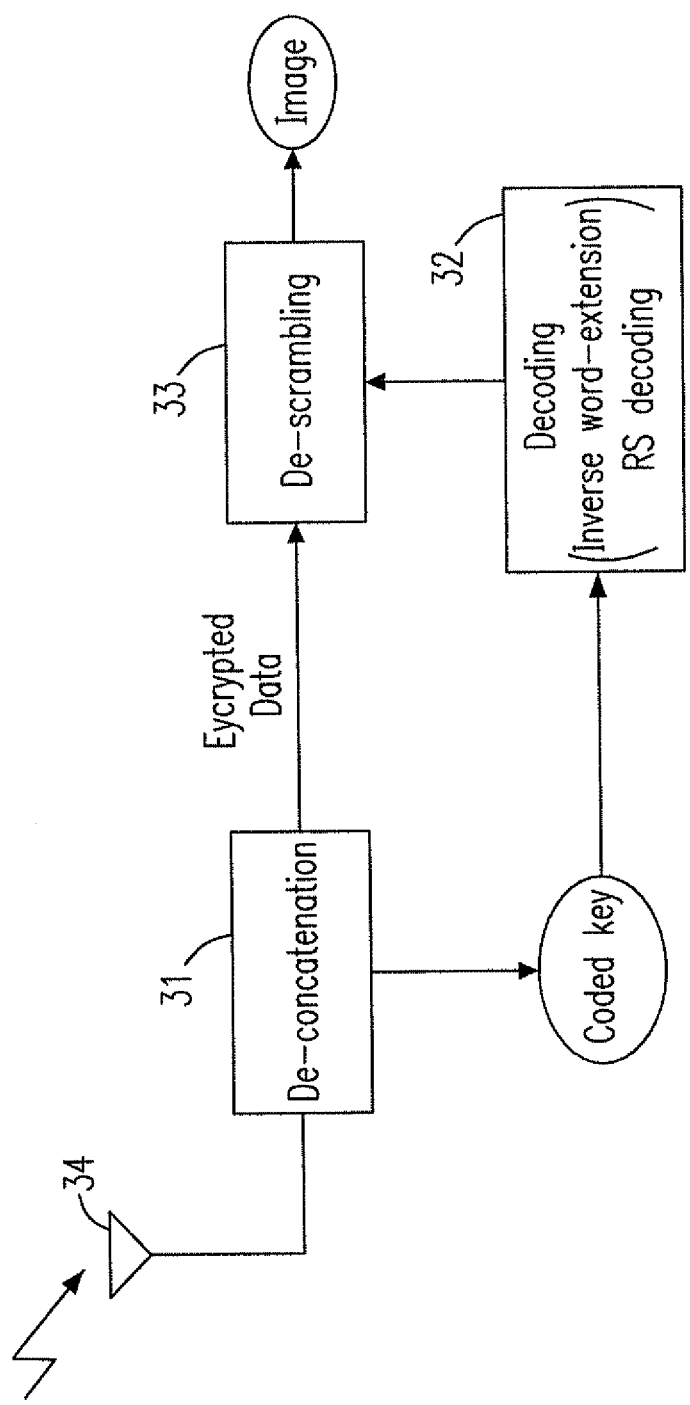
FIG. 3 is a diagram schematically showing the implementation at the receiver using the wireless communication method according to the present invention.

Please refer to FIG. 3, which is a diagram schematically showing the implementation at the receiver using the wireless communication method according to the present invention. As shown in FIG. 3, the encoded data which has been received through the antenna 34 of the receiver is deconcatenated in block 31. After the deconcatenation, the encoded encryption key with the bit-energy-to-noise-ratio no less than the designated one is correctly decoded in block 32 and the scrambled information is descrambled into the original information (image) with the key in block 33. On the other hand, the encoded encryption key with the bit-energy-to-noise-ratio less than the designated one can not be correctly decoded in block 32 and the scrambled information fails to descramble into the original information in block 33.

Figure 4:
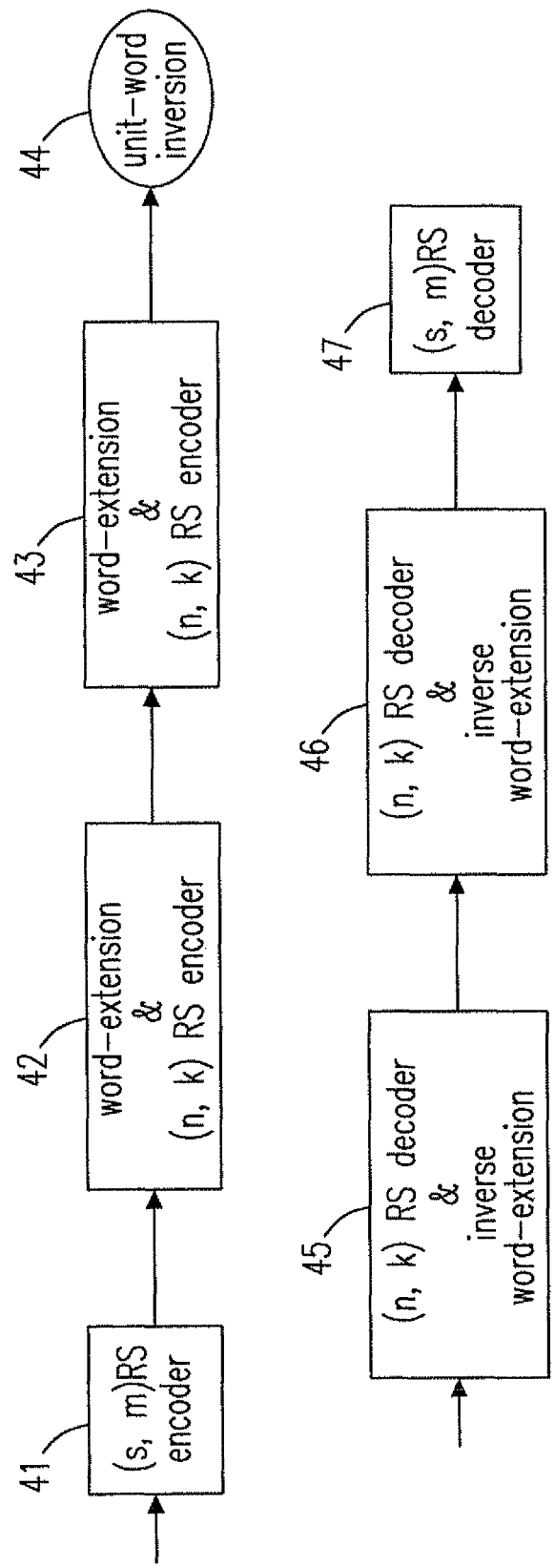
FIG. 4 is a diagram schematically showing the encoding and decoding process of the encryption key used in the wireless communication method according to the present invention.

Please refer to FIG. 4, which is a diagram schematically showing the coding process of the encryption key used in the wireless communication method according to the present invention. For the convenience of the description, the process is completed in a two-stage encoder and a two-stage decoder though the number of the encoding/decoding stage can be more than two.

In the two-stage encoder of the transmitter shown in FIG. 4, the encryption key is firstly encoded through a (s, m) RS encoder 41. For simplicity, a symbol is called a unit-word in the coding scheme. Then each unit-word in the output codewords of previous stage is extended and encoded with (n, k) RS encoders for two stages 42 & 43. Finally, an appropriate number of unit-words in each constituent codewords of the encoded encryption key are inverted through the unit-word inverter 44 to attain the designated bit-energy-to-noise-ratio. In addition, the number of inverted unit-word can adjust the designated bit-energy-to-noise-ratio.

In the two-stage decoder of the receiver shown in FIG. 4, the received codewords are decoded with (n, k) RS decoders and inverse-extended for two stages 45 & 46. Then the output codeword is finally decoded through a (s, m) RS decoder 47 into the decoded encryption key.

Each stage of the encoding process includes the word-extension process and an (n, k) R-S encoder. In a preferable embodiment, a binary v-tuple symbol is called a unit-word in the coding scheme. Let u be a unit-word to be encoded with an (n, k) R-S encoder. First, the word-extension process converts u into a codeword W consisting of k unit-words, i.e. ($w_1$, $w_2$, ..., $w_k$) and $w_i$ is a unit-word. For a given u, we randomly generate first k-1 unit-words ($w_1$, $w_2$, ..., $w_{k-1}$) and then the k-th unit-word, $w_k$, is given as $$w_k = u \oplus w_1 \oplus w_2 \oplus \ldots \oplus w_{k-1}, \quad (1)$$

where "$\oplus$" denotes binary addition of the unit-words. Note that, if W is given, we can obtain u through the inverse word-extension process as below:

$$u = w_1 \oplus w_2 \oplus \ldots \oplus w_k. \quad (2)$$

Next, the codeword W is encoded with the (n, k) R-S encoder and the resultant codeword consists of n unit-words.

In a word, the word-extension process makes the size of the extended codeword W consistent with the information block of the (n, k) R-S code, and the R-S coding makes the codeword have inherent error-correcting capability. In addition, the correct probability of output unit-word approximates to that of the input extended codeword in the inverse word-extension process.

Figure 5:
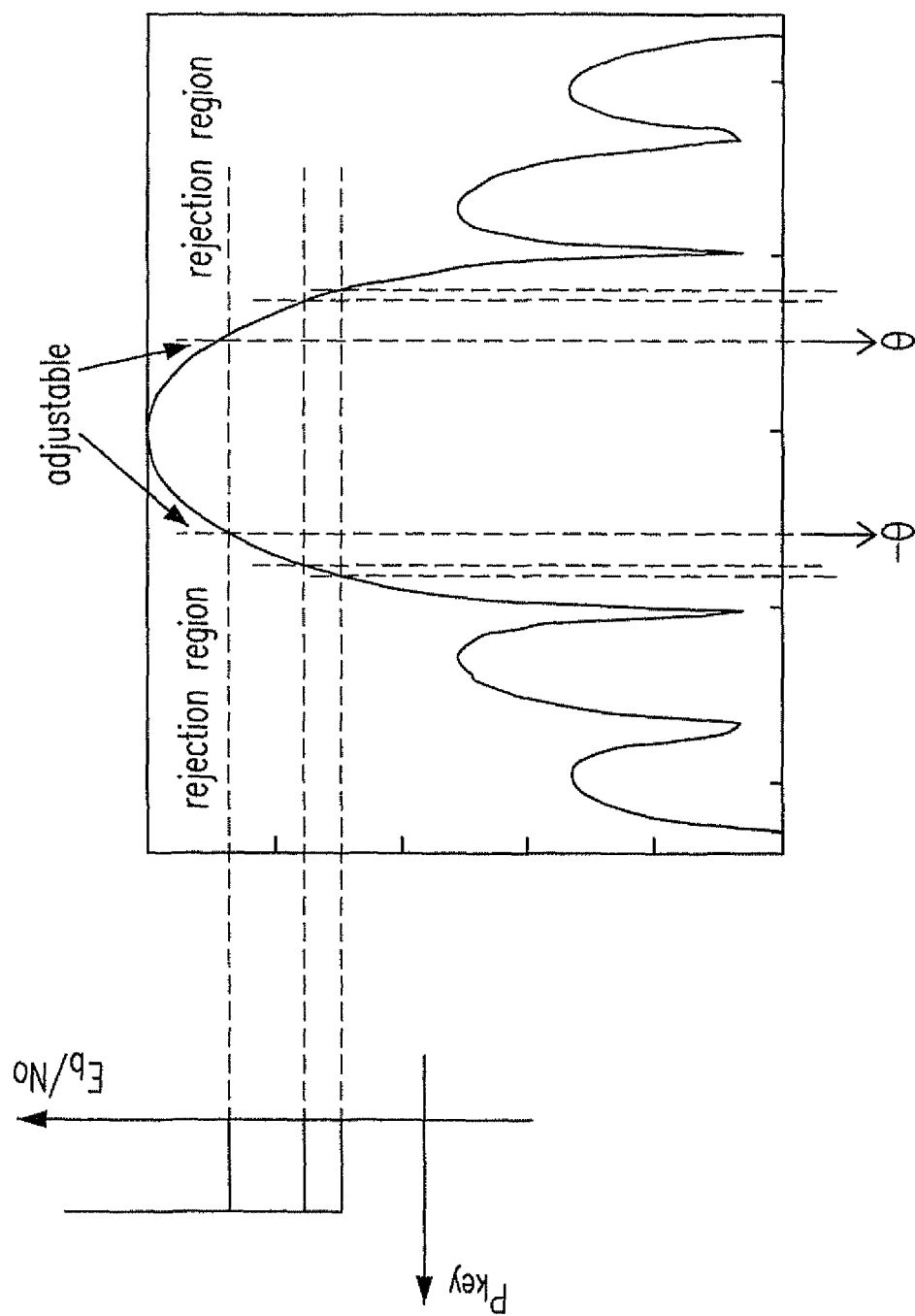
FIG. 5 is a diagram schematically showing the relation between the designated bit-energy-to-noise-ratio ($E_b/N_o$) and the designated beamwidth of the virtual antenna radiation pattern according to the present invention.

Please refer to FIG. 5, which is a diagram schematically showing the relation between the designated bit-energy-to-noise-ratio ($E_b/N_o$) and the clearly-defined designated beamwidth |θ| of the virtual antenna radiation pattern according to the present invention. It is clear that the designated beamwidth of the accepted region defined by the sharp cutoff varies with the designated bit-energy-to-noise-ratio ($E_b/N_o$). That is to say, by adjusting the designated bit-energy-to-noise-ratio ($E_b/N_o$), the data power and accordingly the accepted region defined by the sharp cutoff can be controlled adequately. With more stages of the encoding/decoding process, the virtual antenna radiation pattern is sharper.

It is noted that the wireless communication method provided in the present invention forms a virtual antenna radiation pattern with clearly-defined designated beamwidth only by using coding technique without changing the real antenna radiation pattern.

A coding scheme applying the wireless communication method of the present invention is demonstrated on the communication satellite ST-1 of EUROSTAR 2000+ system which is jointly owned by Singapore Telecom and Chunghwa Telecom of Taiwan. The satellite locates at geosynchronous orbit of 88° E. The signal transmission and reception are performed in the same ground station at (25N08', 121E34'). The uplink signal is vertically polarized, and the downlink signal is horizontally polarized. The isolation between the two polarizations is greater than 30 dB.

The demonstration can be divided into three parts.

A. Data Encoding:
1) Take Lena image as the source image, and scramble it with a 128-bit key.
2) Encode the key with two-stage coding scheme of constituent (s, m)=(32, 16) and (n, k)=(255, 223) RS codes, and q unit-words in each output codeword after the second (255,223) RS encoder are inverted regarding a designated bit-energy-to-noise ratio.
3) Combine the encoded key and the scrambled image together, and write them into a BMP file.

B. Encoded Data Transmission:
1) Measure and record current channel BER with the communications analyzers of TTC Firebird 6000 before data transmission.
2) Transmit the encoded data from one laptop to another laptop through the satellite channel with Trivial File Transfer Protocol (TFTP).

C. Data Decoding:
1) Read the received BMP file, and separate the encoded key from the scrambled image.

2) Decode the key and use the decoded key to descramble the image.

Figure 6:
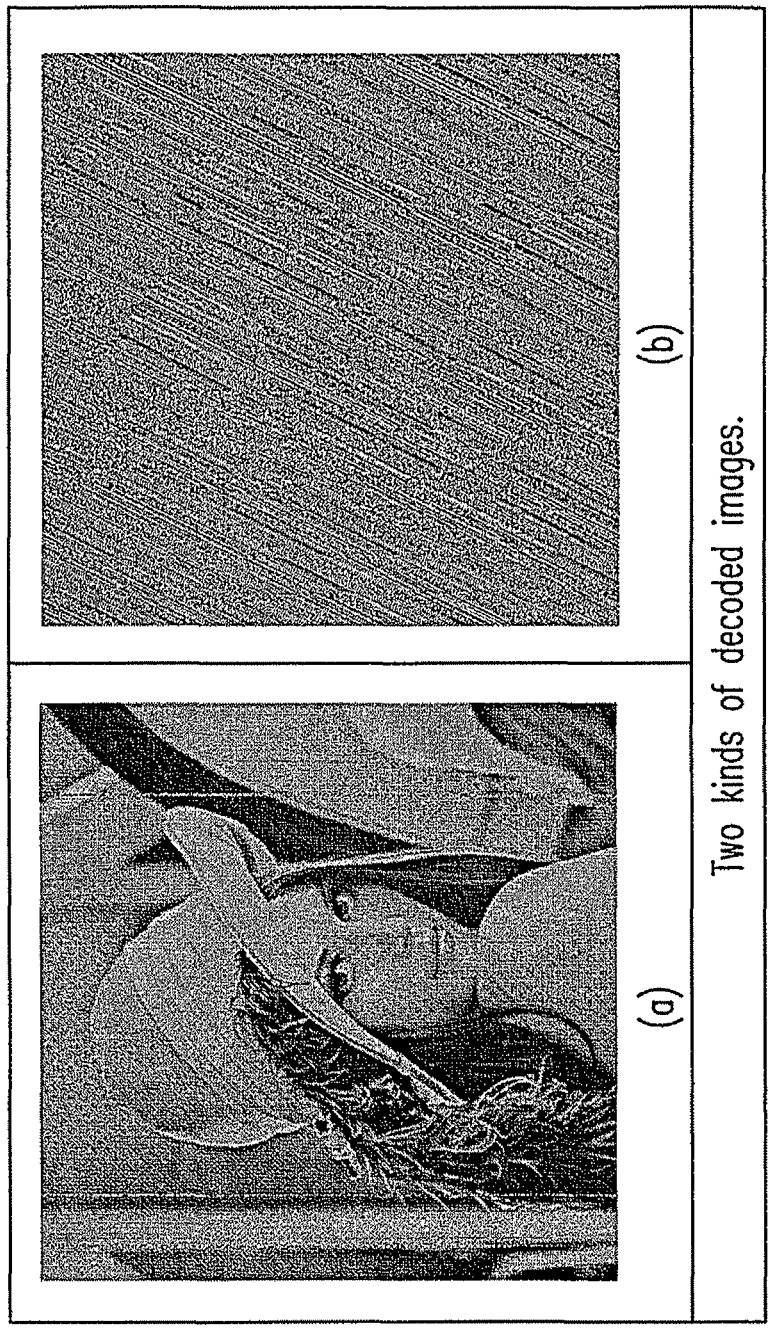
FIG. 6 is a diagram schematically showing the two kinds of descrambled images obtained in the experiment according to the present invention.
Figure 7:
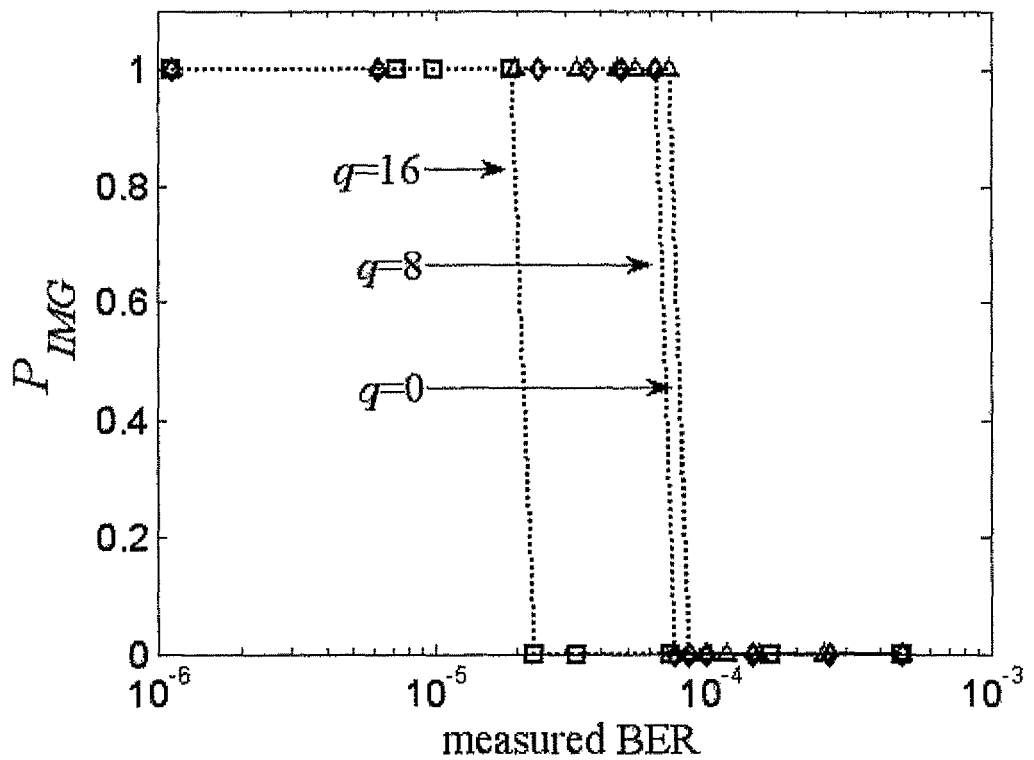
FIG. 7 is a diagram schematically showing the measured performance (in bit-error-rate) obtained in the experiment according to the present invention.

The two kinds of descrambled images will be obtained after the step C as shown in FIG. 6. One is the recognizable image as shown in FIG. 6(a), and the other is the corrupted image as shown in FIG. 6(b). The averaged probability of obtaining the recognizable image in terms of the measured BER, $P_{IMG}$, is shown in FIG. 7. When $P_{IMG}=1$, the image is recognizable. Otherwise, $P_{IMG}=0$, the image is corrupted. According to FIG. 7, the brick-wall error performance of the proposed scheme on the communication satellite is clarified. The sharp cutoff occurs within 0.1 dB resolution of $E_b/N_o$, and the sharp cutoff is shifted with q. Detailed values about the sharp cutoff are given in Table I.

TABLE I

Values of Sharp Cutoff in FIG. 7.

|  | Measured BER | Estimated $E_b/N_o$ |
| --- | --- | --- |
| q = 0 | $7.47 \times 10^{-5} \sim 8.3 \times 10^{-5}$ | 9.65~9.54 |
| q = 8 | $6.4 \times 10^{-5} \sim 7.45 \times 10^{-5}$ | 9.76~9.65 |
| q = 16 | $1.88 \times 10^{-5} \sim 2.3 \times 10^{-5}$ | 10.3~10.2 |

With the similar coding scheme, an information access method for security access limitation is also accomplished by one skilled in the art.

In sum, the present invention provides a wireless communication method, an information access method, and a virtual antenna radiation pattern forming method to construct a virtual spot beam antenna whose covered region can be well defined via coding scheme, and attain the narrow beamwidth which is difficult to be obtained by physical designs.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A wireless communication method, comprising steps of:
   (a) providing an original information;
   (b) encoding the original information into an encoded data regarding a designated bit-energy-to-noise-ratio, the encoding comprising
      (b1) scrambling the original information with an encryption key, and
      (b2) encoding the encryption key into an encoded encryption key with at least one encoding stage regarding the designated bit-energy-to-noise-ratio,
   with the encoded data comprising the encoded encryption key and the scrambled information, and with the designated bit-energy-to-noise-ratio being adjusted with a number of unit-words inverted in the encoded encryption key after a last encoding stage;
   (c) transmitting the encoded data to form a virtual antenna radiation pattern covering a designated region with boundary defined by a sharp cutoff based on the designated bit-energy-to-noise-ratio;
   (d) receiving the encoded data; and
   (e) decoding the encoded data into the original information only when receivers within the designated region have a bit-energy-to-noise-ratio of no less than the designated bit-energy-to-noise-ratio.

2. A wireless communication method as claimed in claim 1, wherein the step (b2) further comprises:
   (b21) extending each unit-word in the output codeword of previous encoding stage to an extended codeword; and
   (b22) encoding the extended codeword into the encoded data with inherent error-correcting capability.

3. A wireless communication method as claimed in claim 2, wherein the step (b21) further comprises:
   extending each unit-word (u) to the extended codeword (w1, w2, . . . , wk) of size (k) consistent with the information block of the error-correcting code, e.g. RS code; and
   randomly generating the first k-1 unit-words (w1, w2, . . . , wk-1) and obtain the k-th unit-word (wk) by a binary addition of the unit-word (u) and the first k-1 unit-words (w1, w2, . . . , wk-1).

4. A wireless communication method as claimed in claim 1, wherein the step (e) further comprises:
   (e1) decoding the encoded encryption key with the number of stage corresponding to the encoding process; and
   (e2) descrambling the scrambled information into the original information;
   wherein if the encoded encryption key with the bit-energy-to-noise-ratio no less than the designated one is correctly decoded, the scrambled information is descrambled into the original information with the decoded encryption key, and if the encoded encryption key with the bit-energy-to-noise-ratio less than the designated one is not correctly decoded, the scrambled information fails to be descrambled into the original information.

5. A wireless communication method as claimed in claim 4, wherein the step (e1) further comprises:
   decoding the encoded data into the extended codeword; and
   inverse-extending the extended codeword to the unit-word for decoding process in next stage;
   wherein the k-unit-word codeword is inverse-extended to a unit-word by binary addition of all the k unit-words.

6. An information access method, comprising steps of:
   (a) providing an original information;
   (b) encoding the original information into an encoded data regarding a designated data power, the encoding comprising
      (b1) scrambling the original information with an encryption key, and
      (b2) encoding the encryption key into an encoded encryption key with at least one encoding stage regarding the designated data power,
   with the encoded data comprising the encoded encryption key and the scrambled information, and with the designated data power being adjusted with a number of unit-words inverted in the encoded encryption key after a last encoding stage;
   (c) transmitting the encoded data to cover a designated region defined by a boundary based on the designated data power;
   (d) receiving the encoded data; and
   (e) decoding the encoded data into original information only when receivers within the designated region have a data power of no less than the designated data power.

7. An information access method as claimed in claim 6, wherein the step (b2) further comprises:
   (b21) extending each unit-words in the output codeword of previous encoding stage to an extended codeword; and (b22) encoding the extended codeword into the encoded data with inherent error-correcting capability.

8. An information access method as claimed in claim 7 wherein the step (b21) further comprises:

extending each unit-word (u) to the extended codeword (w1, w2, . . . , wk-1) of size (k) consistent with the information block of the error-correcting code; and randomly generating the first k-1 unit-words (w1, w2, . . . , wk-1) and obtain the k-th unit-word (wk) by a binary addition of the unit-word (u) and the first k-1 unit-words (w1, w2, . . . , wk-1).

9. An information access method as claimed in claim 6, wherein the step (e) further comprises:

(e1) decoding the encoded encryption key with the number of stage corresponding to the encoding process; and (e2) descrambling the scrambled information into the original information;

wherein if the encoded encryption key with data power no less than the designated one is correctly decoded, the scrambled information is descrambled into the original information with the decoded encryption key, and if the encoded encryption key with data power less than the designated one is not correctly decoded, the scrambled information fails to be descrambled into the original information.

10. An information access method as claimed in claim 9, wherein the step (e1) further comprises:

decoding the encoded data into the extended codeword; and inverse-extending the extended codeword to the unit-words for decoding process in next stage;

wherein the k-unit-word codeword is inverse-extended to a unit-word by binary addition of all the k unit-words.

11. A virtual antenna radiation pattern forming method, comprising steps of:

(a) providing an original information;

(b) encoding the original information into an encoded data regarding a designated bit-energy-to-noise-ratio, with the encoding comprising (b1) scrambling the original information with an encryption key, and (b2) encoding the encryption key into an encoded encryption key with at least one encoding stage regarding the designated bit-energy-to-noise-ratio, with the encoded data comprising the encoded encryption key and the scrambled information, and with the designated bit-energy-to-noise-ratio being adjusted with a number of unit-words inverted in the encoded encryption key after a last encoding stage; and (c) transmitting the encoded data to form a virtual antenna radiation pattern with a designated beamwidth defined by a sharp cutoff based on the designated bit-energy-to-noise-ratio.

12. A virtual antenna radiation pattern forming method as claimed in claim 11, wherein the step (b2) further comprises:

(b21) extending each unit-words in the output codeword of previous encoding stage to an extended codeword; and (b22) encoding the extended codeword into the encoded data with inherent error-correcting capability.

13. A virtual antenna radiation pattern forming method as claimed in claim 12, wherein the step (b21) further comprises:

extending each unit-word (u) to the extended codeword (w1, w2, . . . , wk-1) of size (k) consistent with the information block of the error-correcting code; and randomly generating the first k-1 unit-words (w1, w2, . . . , wk-1) and obtain the k-th unit-word (wk) by a binary addition of the unit-word (u) and the first k-1 unit-words (w1, w2, . . . , wk-1).

* * * * *